United States Patent [19]
Kawazome

[11] Patent Number: 6,148,246
[45] Date of Patent: Nov. 14, 2000

[54] SEMICONDUCTOR PROCESS SYSTEM, ITS CONTROL METHOD, COMPUTER READABLE MEMORY, AND DEVICE MANUFACTURING METHOD

[75] Inventor: Takeshi Kawazome, Utsunomiya, Japan

[73] Assignee: Canon Kabushiki Kaisha, Tokyo, Japan

[21] Appl. No.: 09/095,067

[22] Filed: Jun. 10, 1998

[30] Foreign Application Priority Data

Jun. 13, 1997 [JP] Japan .................................... 9-171258

[51] Int. Cl.[7] .................................................. G06F 19/00
[52] U.S. Cl. ........................................... 700/121; 700/106
[58] Field of Search ................................... 700/121, 112, 700/106, 107, 99, 100, 102, 115, 116, 97, 101

[56] References Cited

U.S. PATENT DOCUMENTS

| | | | |
|---|---|---|---|
| 4,027,246 | 5/1977 | Caccoma et al. | 700/113 |
| 4,974,166 | 11/1990 | Maney et al. | 700/121 |
| 5,231,585 | 7/1993 | Kobayashi et al. | 700/96 |
| 5,696,689 | 12/1997 | Okumura et al. | 700/112 |
| 5,867,388 | 2/1999 | Okumura et al. | 700/121 |
| 6,000,830 | 12/1999 | Asano et al. | 700/121 |

*Primary Examiner*—William Grant
*Assistant Examiner*—Zoila Cabrera
*Attorney, Agent, or Firm*—Fitzpatrick, Cella, Harper & Scinto

[57] ABSTRACT

In a semiconductor process system having a semiconductor process apparatus for performing various jobs to manufacture a semiconductor device, a material convey unit for conveying materials used in the jobs to the semiconductor process apparatus, and a host computer for monitoring the operation state of the semiconductor process apparatus, instructing the material convey unit to convey a material used in a required job, and instructing the semiconductor process apparatus to execute the job, the host computer makes a job reservation that informs the semiconductor process apparatus of the job to be executed simultaneously with the convey instruction of the material used in the required job, and the semiconductor process apparatus confirms in accordance with the job reservation if job data required for the reserved job is present in the apparatus, and takes a predetermined measure such as requesting a job data transfer means to transfer job data required, or outputting a predetermined warning, if the job data is not present.

10 Claims, 7 Drawing Sheets

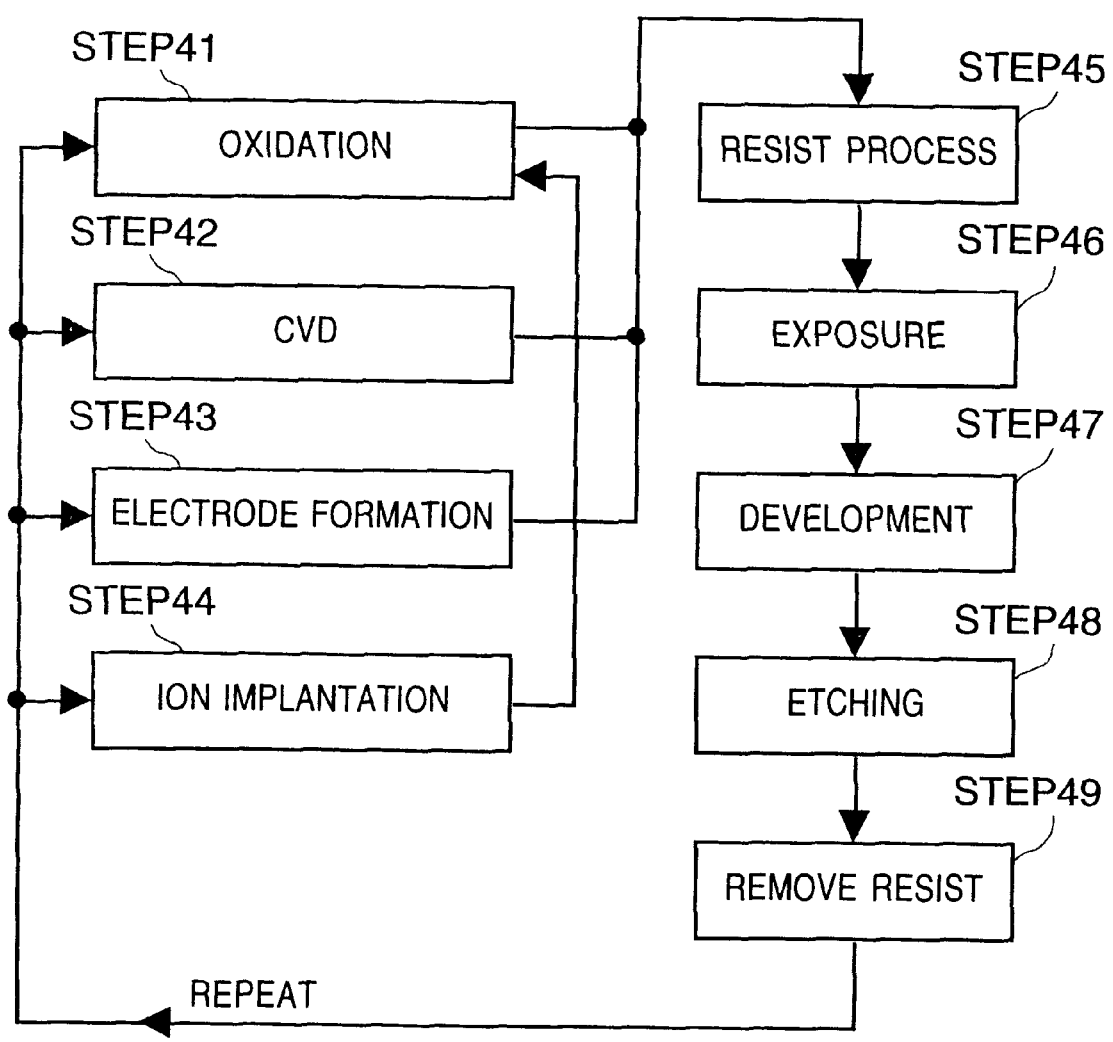

SEMICONDUCTOR PROCESS SYSTEM, ITS CONTROL METHOD, COMPUTER READABLE MEMORY, AND DEVICE MANUFACTURING METHOD

BACKGROUND OF THE INVENTION

The present invention relates to a semiconductor process system, its control method, computer readable memory and a device manufacturing method which can use the system.

A conventional semiconductor process system comprises a host computer for managing semiconductor processes, a semiconductor processing apparatus for performing semiconductor processes, and means for conveying materials such as wafers and the like, and automatically executes semiconductor processes via information communications of these components. In such system, the host computer instructs the convey means to convey materials to the semiconductor process apparatuses while monitoring the operation state of the semiconductor process apparatus, and the semiconductor process apparatus sends a material receipt report to the host computer upon reception of the material conveyed by the convey means. The host computer then issues a job instruction to the semiconductor process apparatus, which performs the semiconductor processes in accordance with the instruction. The semiconductor process apparatus holds job data such as process conditions and the like required for the instructed jobs in files, a database, and the like in advance, and executes the processes on the basis of the held job data upon reception of the job instruction from the host computer.

In this fashion, in the conventional system, the semiconductor process apparatus receives materials, and performs processes on the basis of job data held in advance in accordance with job instructions received from the host computer. However, when the semiconductor process apparatus does not hold any job data required for the instructed jobs, it must cancel or suspend the jobs, and the required job data must be installed on the semiconductor process apparatus to restart jobs. This results in poor job efficiency.

SUMMARY OF THE INVENTION

It is an object of the present invention to improve the process efficiency in the semiconductor processes or semiconductor device manufacturing technique in consideration of the above-mentioned conventional problems.

In order to achieve the above object, according to the present invention, there is provided a semiconductor process system, which comprises a semiconductor process apparatus for performing various jobs to manufacture a semiconductor device, material convey means for conveying materials used in the jobs to the semiconductor process apparatus, and a host computer for monitoring an operation state of the semiconductor process apparatus, instructing the material convey means to convey a material used in a required job, and instructing the semiconductor process apparatus to execute the job, wherein the host computer makes a job reservation that informs the semiconductor process apparatus of the job to be executed simultaneously with the convey instruction of the material used in the required job, and the semiconductor process apparatus confirms in accordance with the job reservation if job data required for the reserved job is present in the apparatus, and takes a predetermined measure if the job data is not present.

Also, according to the present invention, there is provided a device manufacturing method for manufacturing a semiconductor device by monitoring, using a host computer, an operation state of a semiconductor process apparatus for performing various jobs to manufacture the semiconductor device, instructing material convey means to convey a material used in a required job, and instructing the semiconductor process apparatus to execute the job, wherein the host computer makes a job reservation that informs the semiconductor process apparatus of the job to be executed simultaneously with the convey instruction of the material used in the required job, and the semiconductor process apparatus confirms in accordance with the job reservation if job data required for the reserved job is present in the apparatus, and takes a predetermined measure if the job data is not present.

According to the present invention, since the predetermined measure is taken, for example, required job data is prepared, while the convey means conveys the required materials, the job efficiency of the semiconductor processes can be improved.

BRIEF DESCRIPTION OF THE DRAWINGS

FIG. 7 is a flow chart showing the detailed flow of a wafer process in FIG. 6.

DETAILED DESCRIPTION OF THE PREFERRED EMBODIMENTS

In the preferred embodiment of the present invention, the semiconductor process apparatus can request the job data transfer means, which can transfer job data required for various jobs to the semiconductor process apparatus, to transfer job data required for the reserved job as the predetermined measure.

The semiconductor process apparatus may output a predetermined warning as the predetermined measure.

Also, when the semiconductor process apparatus has a controller for controlling the apparatus itself, the controller receives the job reservation, confirms the presence/absence of job data, and takes the predetermined measure.

According to these features, the job can be prevented from being canceled or suspended due to the absence of job data required for the job in the apparatus, and any job efficiency drop of the semiconductor processes can be avoided.

The present invention will be described in more detail below by way of its embodiments.

[Embodiment 1]

Figure 1:
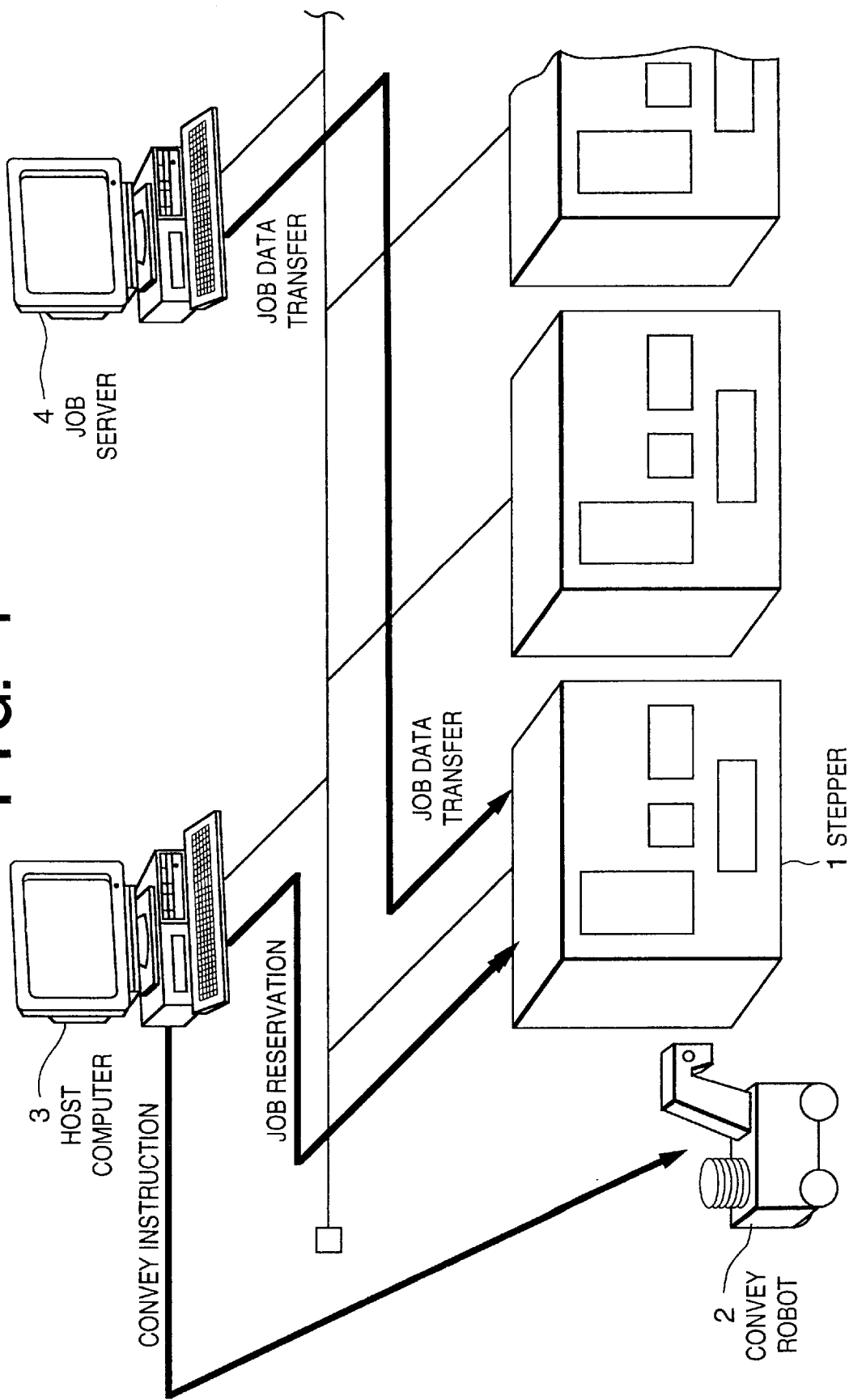
FIG. 1 is a schematic diagram showing a semiconductor process system according to Embodiment 1 of the present invention.

FIG. 1 is a schematic diagram showing an example of the arrangement of a semiconductor process system according to the present invention. This system has a stepper 1 for performing exposure of semiconductors, a convey robot 2 for conveying a wafer carrier to the stepper 1, a host computer 3 for monitoring the operation state of the stepper 1, directing the convey robot 2 to convey the wafer carrier, and supplying a job instruction to the stepper 1, and a job server 4 for transferring job data required for the stepper 1 to expose to the stepper 1. These apparatuses can communicate with each other via a network, radio communications, or the like.

Figure 2:
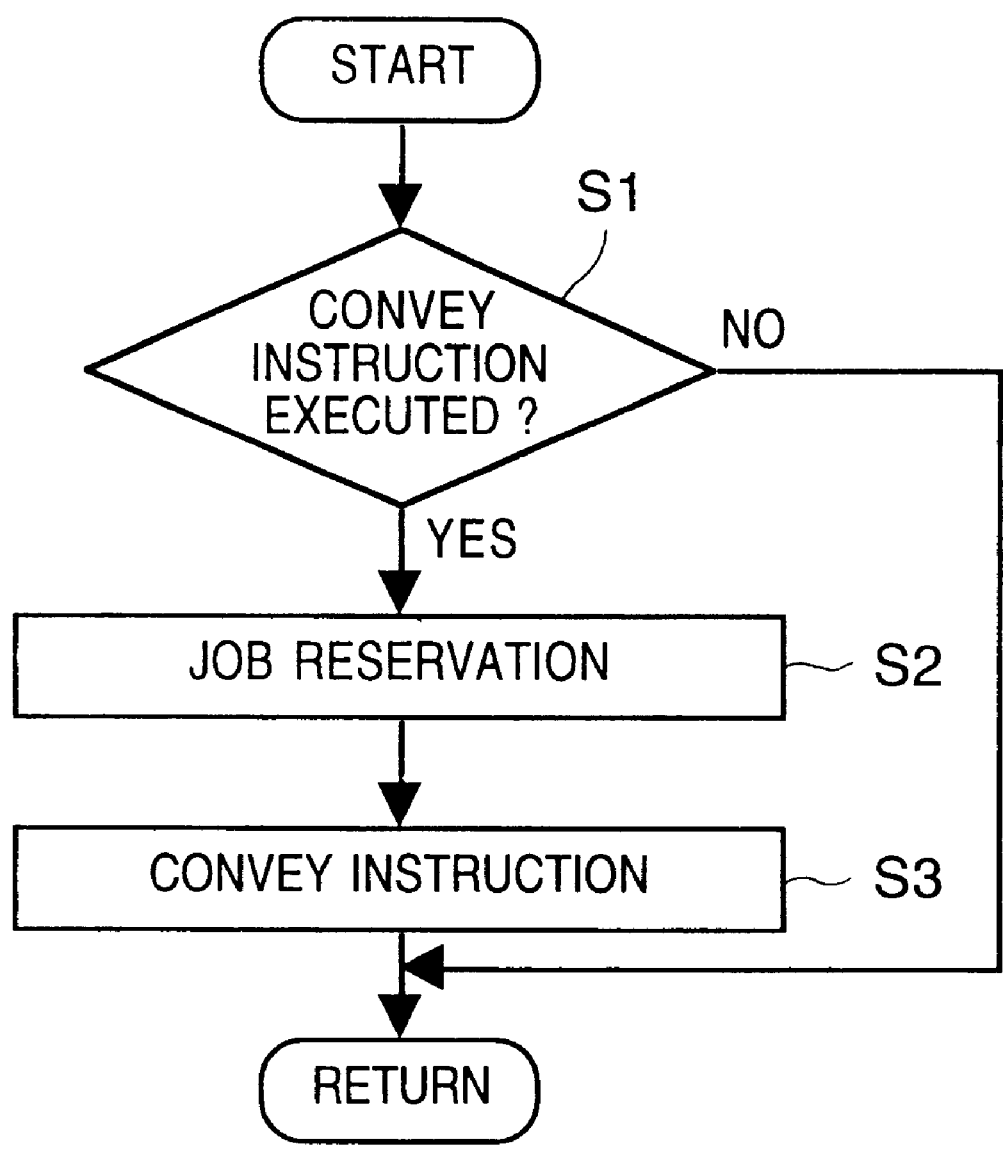
FIG. 2 is a flow chart showing the flow of the process routine executed when a host computer in the system shown in FIG. 1 issues a wafer carrier convey instruction.

FIG. 2 shows the flow of the process routine executed when the host computer 3 issues a wafer carrier convey instruction. When this process routine is started, the host computer 3 checks based on the operation state of the stepper 1 and the like in step S1 if a wafer carrier is to be conveyed to the stepper 1. If the host computer 3 determines that the wafer carrier is to be conveyed to the stepper 1 (YES in step S1), it makes a job reservation at the stepper 1 in step S2. Upon making the job reservation, the host computer 3 transmits the reservation while appending information indicating the type of wafer carrier, the type of job in which the wafer carrier is to be used, and the like to the reservation. In step S3, the host computer 3 directs the convey robot 2 to convey the wafer carrier to the stepper 1, thus ending the routine. If the computer 3 determines in step S1 that no wafer carrier is conveyed to the stepper 1 (NO in step S1), it ends the process routine.

Figure 3:
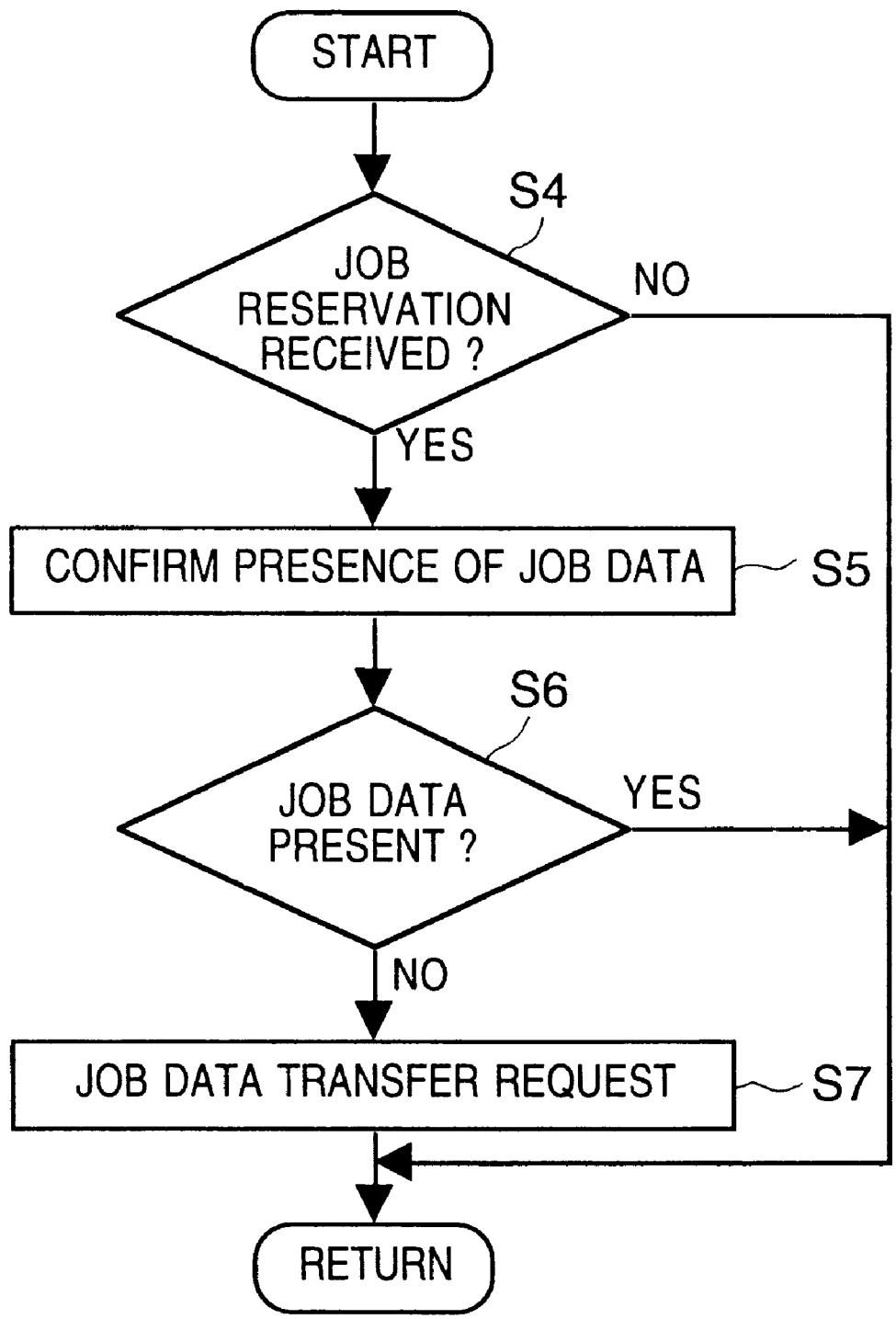
FIG. 3 is a flow chart showing the flow of the process routine executed when a stepper in the system shown in FIG. 1 receives a job reservation from the host computer.

FIG. 3 shows the flow of the process routine executed when the stepper 1 receives a job reservation transmitted from the host computer 3. In this process routine, it is checked in step S4 if a job reservation has been received from the host computer 3. If no job reservation has been received (NO in step S4), the process routine ends. On the other hand, if a job reservation has been received (YES in step S4), it is confirmed in step S5 if job data included in the job reservation is held in the stepper 1, and the flow advances to step S6. It is checked in step S6 if it is confirmed that the job data is present in the stepper 1. If the presence of the job data is confirmed (YES in step S6), the process routine ends; otherwise (NO in step S6), a job data transfer request is transmitted to the job server 4 in step S7, thus ending the process routine.

Figure 4:
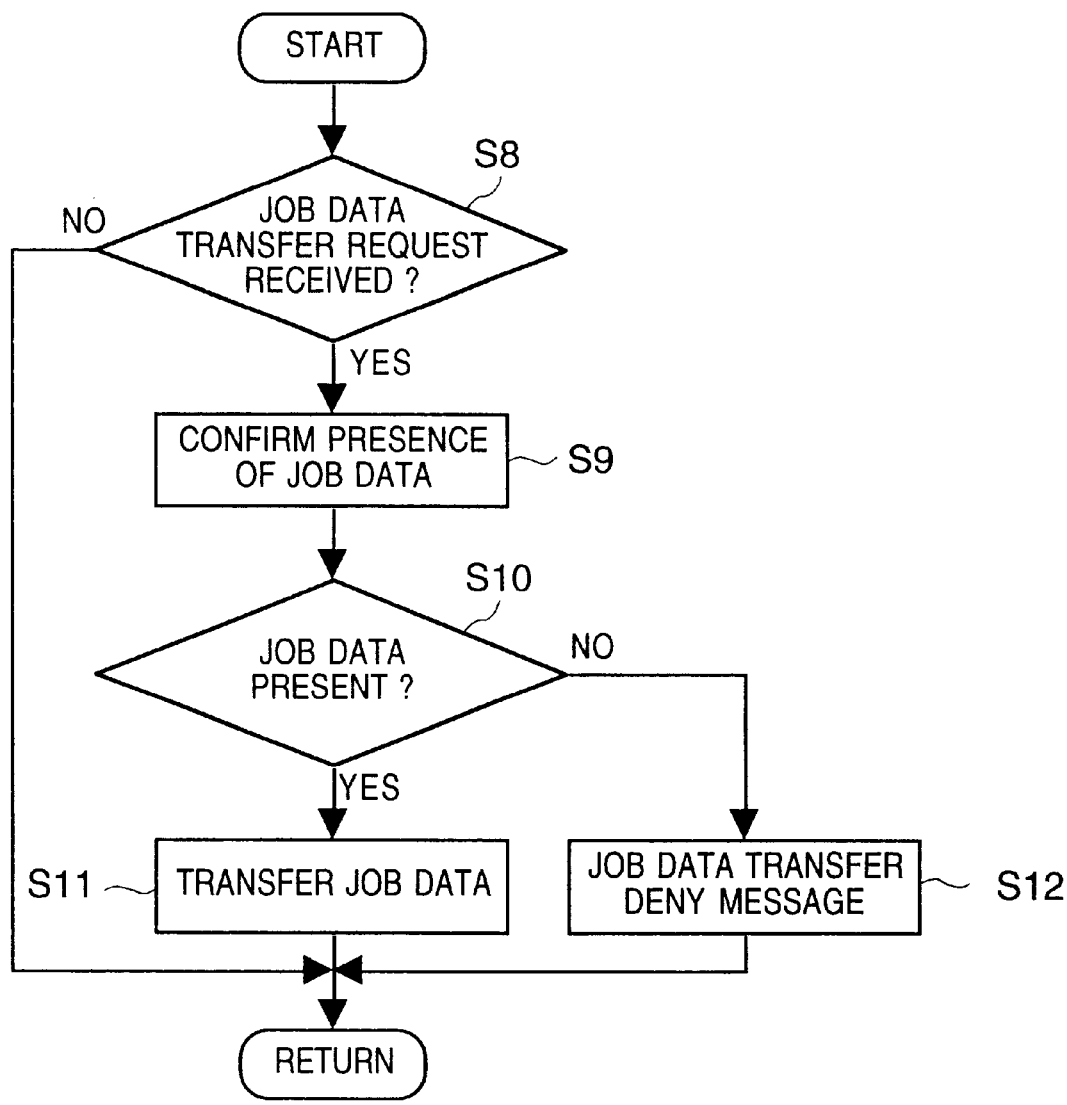
FIG. 4 is a flow chart showing the flow of the process routine executed when a job server in the system shown in FIG. 1 receives a job data transfer request from the stepper.

FIG. 4 shows the flow of the process routine executed when the job server 4 receives the job data transfer request from the stepper 1. It is checked in step S8 if a job data transfer request has been received from the stepper 1. If the request has been received (YES in step S8), the flow advances to step S9; otherwise (NO in step S8), the process routine ends. It is confirmed in step S9 if the job data corresponding to the transfer request is held in a storage means of the job server 4, and the flow advances to step S10. It is checked in step S10 if it is confirmed that the job data is held. If it can be confirmed that the job data is held (YES in step S10), the job data is transferred to the stepper 1 in step S11, thus ending the process routine. On the other hand, if it is not confirmed that the job data is held (NO in step S10), a job data transfer deny message is sent to the stepper 1 in step S12, thus ending the process routine.

Upon reception of the job data transfer deny message from the job server 4, the stepper 1 produces a warning that prompts the operator to install the job data.

Figure 6:
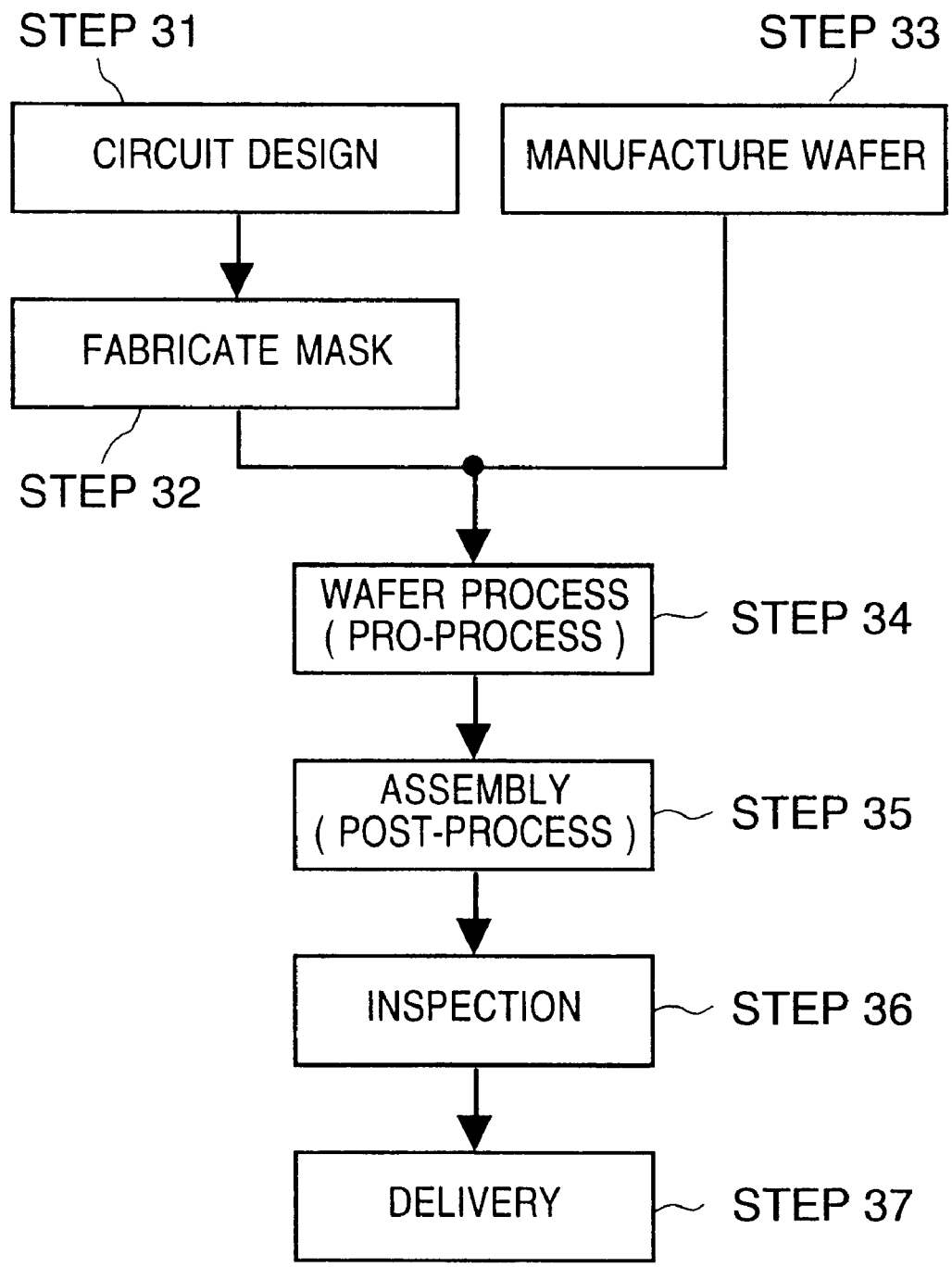
FIG. 6 is a flow chart showing the flow in the manufacture of microdevices that can be manufactured by the system own in FIG. 1.

An example of the device manufacturing method that can use this system will be explained below. FIG. 6 shows the flow in the manufacture of a microdevice (semiconductor chips such as ICs, LSIs, and the like, liquid crystal panels, CCDs, thin film magnetic heads, micromachines, and the like). In step 31 (circuit design), the circuit design of a semiconductor device is made. In step 32 (manufacture mask), a mask formed with a designed circuit pattern is manufactured. In step 33 (fabricate wafer), a wafer is fabricated using materials such as silicon and the like. Step 34 (wafer process) is called a pre-process, and an actual circuit is formed by lithography using the prepared mask and wafer. The next step 35 (assembly) is called a post-process, in which semiconductor chips are assembled using the wafer obtained in step 34, and includes an assembly process (dicing, bonding), packaging process (encapsulating chips), and the like. In step 36 (inspection), inspections such as operation confirmation tests, durability tests, and the like of semiconductor devices assembled in step 35 are run. Semiconductor devices are completed via these processes, and are delivered (step 37).

FIG. 7 shows the detailed flow of the wafer process. In step 41 (oxidation), the surface of the wafer is oxidized. In step 42 (CVD), an insulating film is formed on the wafer surface. In step 43 (electrode formation), electrodes are formed by deposition on the wafer. In step 44 (ion implantation), ions are implanted into the wafer. In step 45 (resist process), a photosensitive agent is applied on the wafer. In step 46 (exposure), the circuit pattern on the mask is printed on the wafer by exposure using the above-mentioned exposure apparatus. In step 47 (development), the exposed wafer is developed. In step 48 (etching), a portion other than the developed resist image is removed by etching. In step 49 (remove resist), the resist film which has become unnecessary after the etching is removed. By repeating these steps, multiple circuit patterns are formed on the wafer.

Using the manufacturing method of this embodiment, highly integrated semiconductor devices that are hard to manufacture by the conventional method can be manufactured with low cost.

[Embodiment 2]

Figure 5:
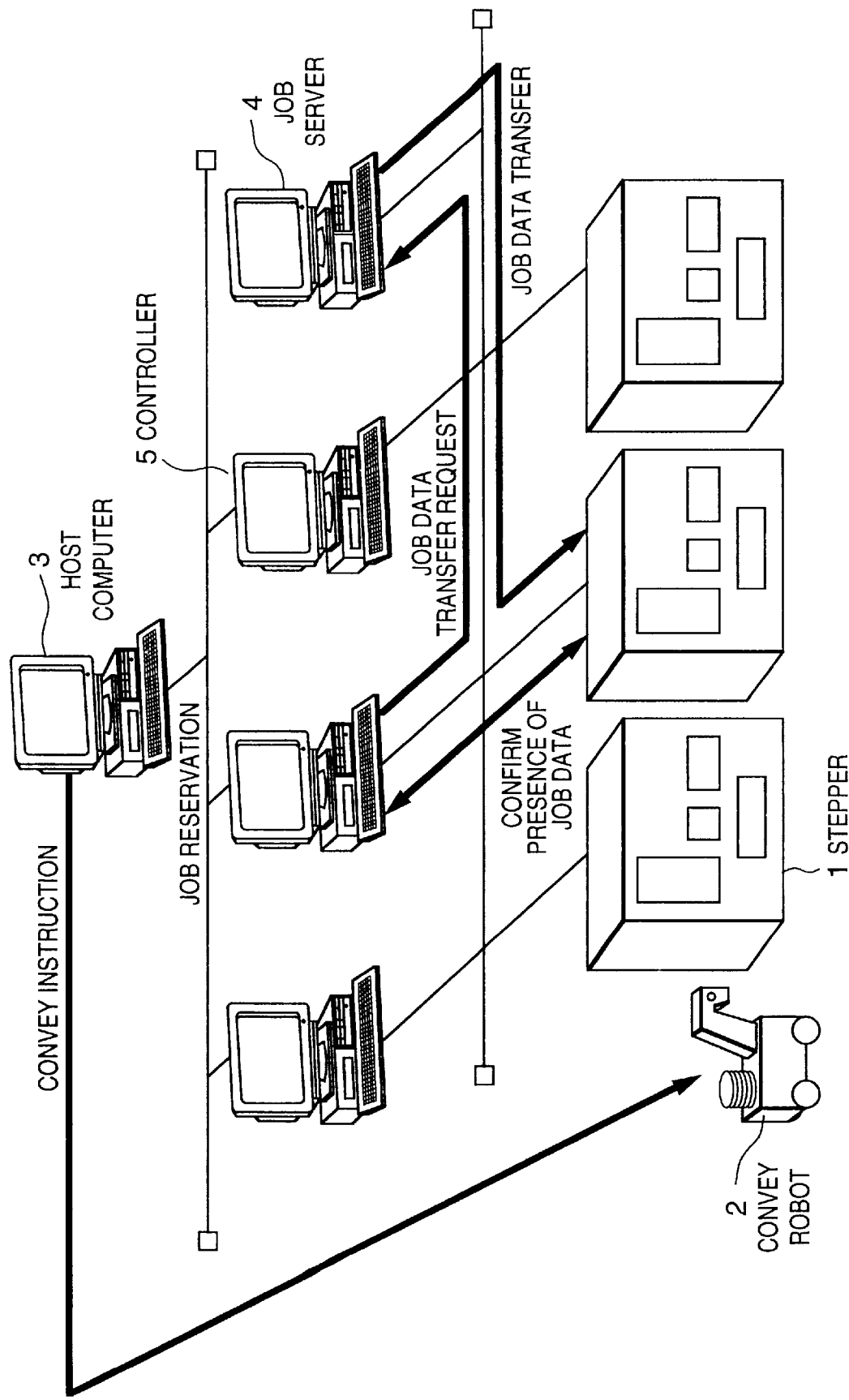
FIG. 5 is a schematic diagram showing a system according to Embodiment 2 of the present invention.

FIG. 5 shows the arrangement of a system having controllers 5 that automatically control the steppers 1. In this system, the host computer 3 makes a job reservation at each controller 5. Upon reception of the job reservation from the host computer 3, the controller 5 sends a request for confirming the presence/absence of the corresponding job data to the stepper 1. Upon reception of the request from the controller 5, the stepper 1 confirms if that job data is present in the stepper, and sends the confirmation result to the controller 5. When the controller 5 receives the confirmation result that indicates the absence of the job data from the stepper 1, it transmits a job data transfer request to the job server 4. Upon reception of the job data transfer request form the controller 5, the job server 4 confirms if the corresponding job data is present in the job server 4, and transfers that job data to the stepper 1 if it is present. On the other hand, if the job data is not present in the job server 4, the job server 4 sends a job data transfer deny message to the controller 5. Upon reception of the job data transfer deny message from the job server 4, the controller 5 produces a warning that prompts the operator to install the job data.

In this embodiment, each controller automatically controls one stepper 1. Alternatively, even when a single controller 5 automatically controls a plurality of steppers 1, the same processing may be done.

[Other Embodiments]

In Embodiments 1 and 2, the stepper has been exemplified as a semiconductor process apparatus. However, the present invention is not limited to such specific apparatus, and can be applied to any other semiconductor process apparatuses that process wafers.

Furthermore, the wafer carrier has been exemplified as the material to be conveyed. However, the present invention can be applied to any other materials required upon processing wafers such as reticles, photosensitive agents, and the like.

To summarize, according to the present invention, whether or not job data required for a reserved job is present in the apparatus is confirmed in response to a job reservation, and if the corresponding job data is not present, a predetermined measure is taken, that is, a job data transfer request is issued or a predetermined warning is output. Hence, the job can be prevented from being canceled or suspended due to the absence of job data required for the job in the apparatus, and any job efficiency drop of the semiconductor processes can be avoided.

Note that the objects of the present invention are also achieved by supplying a storage medium, which records a program code of a software program that can realize the functions of the above-mentioned embodiments to the system or apparatus, and reading out and executing the program code stored in the storage medium by a computer (or a CPU or MPU) of the system or apparatus.

In this case, the program code itself read out from the storage medium realizes the functions of the above-mentioned embodiments, and the storage medium which stores the program code constitutes the present invention.

As the storage medium for supplying the program code, for example, a floppy disk, hard disk, optical disk, magneto-optical disk, CD-ROM, CD-R, magnetic tape, nonvolatile memory card, ROM, and the like may be used.

The functions of the above-mentioned embodiments may be realized not only by executing the readout program code by the computer but also by some or all of actual processing operations executed by an OS (operating system) running on the computer on the basis of an instruction of the program code.

Furthermore, the functions of the above-mentioned embodiments may be realized by some or all of actual processing operations executed by a CPU or the like arranged in a function extension board or a function extension unit, which is inserted in or connected to the computer, after the program code read out from the storage medium is written in a memory of the extension board or unit.

What is claimed is:

1. A semiconductor process system, which comprises a semiconductor process apparatus for performing various jobs to manufacture a semiconductor device, material convey means for conveying materials used in the jobs to said semiconductor process apparatus, and a host computer for monitoring an operation state of said semiconductor process apparatus, instructing said material convey means to convey a material used in a required job, and instructing said semiconductor process apparatus to execute the job, wherein said host computer makes a job reservation that informs said semiconductor process apparatus of the job to be executed simultaneously with the convey instruction of the material used in the required job, and said semiconductor process apparatus confirms in accordance with the job reservation if job data required for the reserved job is present in said apparatus, and takes a predetermined measure if the job data is not present.

2. The system according to claim 1, further comprising job data transfer means which can transfer job data required for performing the various jobs to said semiconductor process apparatus, and wherein said semiconductor process apparatus requests said job data transfer means to transfer the job data required for the reserved job as the predetermined measure.

3. The system according to claim 1, wherein said semiconductor process apparatus outputs a predetermined warning as the predetermined measure.

4. The system according to claim 1, wherein said semiconductor process apparatus has a controller for controlling said apparatus itself, and said controller receives the job reservation, confirms the presence/absence of job data, and takes the predetermined measure.

5. A control method for a semiconductor process system, which comprises a semiconductor process apparatus for performing various jobs to manufacture a semiconductor device, material convey means for conveying materials used in the jobs to said semiconductor process apparatus, and a host computer for monitoring an operation state of said semiconductor process apparatus, instructing said material convey means to convey a material used in a required job, and instructing said semiconductor process apparatus to execute the job, comprising:

the first control step of controlling said host computer to make a job reservation that informs said semiconductor process apparatus of the job to be executed simultaneously with the convey instruction of the material used in the required job; and the second control step of controlling said semiconductor process apparatus to confirm in accordance with the job reservation if job data required for the reserved job is present in said apparatus, and to take a predetermined measure if the job data is not present.

6. The method according to claim 5, further comprising the job data transfer step of transferring job data required for performing the various jobs to said semiconductor process apparatus, and wherein the predetermined measure is taken by transferring the job data required in the reserved job in the job data transfer step.

7. The method according to claim 5, wherein the predetermined measure is taken by outputting a predetermined warning.

8. The method according to claim 5, further comprising the third control step of controlling said semiconductor process apparatus, and wherein the third control step includes the step of receiving the job reservation, confirming the presence/absence of job data, and taking the predetermined measure.

9. A computer readable memory that stores a program code for controlling a semiconductor process system, which comprises a semiconductor process apparatus for performing various jobs to manufacture a semiconductor device, material convey means for conveying materials used in the jobs to said semiconductor process apparatus, and a host computer for monitoring an operation state of said semiconductor process apparatus, instructing said material convey means to convey a material used in a required job, and instructing said semiconductor process apparatus to execute the job, comprising:

a program code of the first control step of controlling said host computer to make a job reservation that informs said semiconductor process apparatus of the job to be executed simultaneously with the convey instruction of the material used in the required job; and a program code of the second control step of controlling said semiconductor process apparatus to confirm in accordance with the job reservation if job data required for the reserved job is present in said apparatus, and to take a predetermined measure if the job data is not present.

10. A device manufacturing method for manufacturing a semiconductor device by monitoring, using a host computer, an operation state of a semiconductor process apparatus for performing various jobs to manufacture the semiconductor device, instructing material convey means to convey a material used in a required job, and instructing said semiconductor process apparatus to execute the job, wherein said host computer makes a job reservation that informs said semiconductor process apparatus of the job to be executed simultaneously with the convey instruction of the material used in the required job, and said semiconductor process apparatus confirms in accordance with the job reservation if job data required for the reserved job is present in said apparatus, and takes a predetermined measure if the job data is not present.

* * * * *